United States Patent [19]
Conboy et al.

[11] Patent Number: 6,005,281
[45] Date of Patent: Dec. 21, 1999

[54] APPARATUS FOR THE NON-CONTACT MANIPULATION OF A SEMICONDUCTOR DIE

[75] Inventors: Michael R. Conboy; Elfido Coss, Jr., both of Austin, Tex.

[73] Assignee: Advanced Micro Devices, Inc., Sunnyvale, Calif.

[21] Appl. No.: 08/852,317

[22] Filed: May 7, 1997

[51] Int. Cl.$^6$ .............................. H01L 27/04; H01L 27/02
[52] U.S. Cl. ......................... 257/531; 343/742; 343/867; 336/200; 336/232
[58] Field of Search ............................ 257/531; 343/742, 343/867; 336/200, 232

[56] References Cited

U.S. PATENT DOCUMENTS

| | | | |
|---|---|---|---|
| 5,382,926 | 1/1995 | Nakahara et al. | 333/161 |
| 5,391,392 | 2/1995 | Kitagawa | 427/81 |
| 5,557,138 | 9/1996 | Ikeda et al. | 257/277 |
| 5,610,340 | 3/1997 | Carr et al. | 73/718 |
| 5,760,456 | 6/1998 | Grzegorek et al. | 257/277 |

OTHER PUBLICATIONS

Greenhouse, H.M., "Design of Planar Rectangular Microelectronic Inductors," IEEE transactions on Parks, Hybrids, and Packaging, vol. PHP–10, No. 2, Jun. 1974, pp. 101–109.

Gupta, K.C. et al., "Computer–Aided Design of Microwave Circuits," Artech House, Inc., 1981, pp. 209–212.

*Primary Examiner*—Wael Fahmy
*Assistant Examiner*—Hung Van Duong
*Attorney, Agent, or Firm*—Kevin L. Daffer; Conley, Rose & Tayon

[57] ABSTRACT

An apparatus and method are presented for non-contact manipulation of a semiconductor die during semiconductor device manufacturing. Multiple die manipulation circuits are formed within specific regions of die areas of a semiconductor wafer. The die manipulation circuits may be formed upon a frontside surface of the wafer or upon a backside surface of the wafer. Following separation of the semiconductor dice from the wafer, a die is positioned above a horizontal surface of a die manipulation apparatus. Each die manipulation circuit receives alternating current (a.c.) power via an alternating magnetic field and uses the a.c. power to produce a static magnetic field. The static magnetic field opposes static magnetic fields formed around one or more levitation coils of the horizontal surface, causing the die to be levitated above the horizontal surface. By varying the relative strengths of the magnetic fields created by the levitation coils, "waves" of magnetic flux may be formed. Such waves of magnetic flux may be used to move the die parallel to the horizontal surface, or to rotate the die in a horizontal plane about an axis normal to the horizontal surface. Each die manipulation circuit includes a pickup coil, a levitation coil, a rectifier, and a capacitor. The horizontal surface of the die manipulation apparatus includes transmitter coils in addition to levitation coils. Each transmitter coil receives a.c. electrical power and produces an alternating magnetic field in response to the a.c. electrical power.

11 Claims, 11 Drawing Sheets

APPARATUS FOR THE NON-CONTACT MANIPULATION OF A SEMICONDUCTOR DIE

BACKGROUND OF THE INVENTION

1. Field of the Invention

This invention relates to semiconductor device manufacturing and more particularly to the manipulation of a semiconductor die during semiconductor device manufacturing.

2. Description of the Relevant Art

Several semiconductor devices (e.g., integrated circuits) are typically formed upon a single semiconductor wafer during a series of semiconductor wafer fabrication operations. A semiconductor wafer has two opposed and substantially planar sides; a frontside surface and a backside surface. After a single-crystal ingot of a semiconductor material (e.g., silicon) has been grown, the ingot is sliced to form multiple wafers. A sequence of shaping and polishing steps are performed upon each wafer in order to produce frontside surfaces suitable for fabricating semiconductor devices. In contrast, the backside surfaces are typically subjected to mechanical damage by abrasion, grooving, or sandblasting during wafer manufacture in order to enhance the use of the frontside surface for the fabrication of semiconductor devices.

During wafer fabrication, the frontside surface of a semiconductor wafer is partitioned into rows and columns, forming separate die areas. One or more semiconductor devices are formed within these die areas using a complex sequence of layering, patterning, doping, and heat treatment processes. Following wafer fabrication, the semiconductor devices formed within each die area are tested for proper operation. Die areas containing non-functional semiconductor devices are identified and either physically marked (e.g., with a drop of red ink) or noted by an appropriate entry in a computer database. The semiconductor dice or "chips" are then separated from the semiconductor wafer by sawing between the defined die areas. Following an optical inspection to ensure the operational dice were not damaged during the sawing operation, each semiconductor die containing operational semiconductor devices is mounted within a protective semiconductor device package.

Following separation from the semiconductor wafer, each individual die must be properly positioned for required operations such as, for example, die inspection, semiconductor device testing, and device packaging. Manipulations of semiconductor dice during such required operations are currently performed using air tables or vacuum wands. The upper surface of an air table has many small holes drilled therethrough. Pressurized air forced through the holes is used to levitate dice above the upper surface of the table, allowing a semiconductor die to be precisely positioned for a required operation. Slender rods are used to vary the position of a levitated die. When the air pressure is reduced, the force of gravity causes the die to come to rest upon the upper surface of the table. A vacuum wand has an air inlet port at one end. Reduced air pressure (i.e., vacuum) at the inlet port of the vacuum wand is used to pick up and position a semiconductor die.

Both air tables and vacuum wands require physical contact with a semiconductor die in order to manipulate the die. Such physical contact may result in damage to the semiconductor die, or may introduce ionic contaminants onto the surface of the die. Such ionic contaminants may deleteriously alter the operational characteristics of the semiconductor device, or may even cause the device to cease to function. In addition, an air table is only able to levitate a semiconductor die when pressurized air exiting the holes in the upper surface of the table can reach one or more surfaces of the die. An air table cannot be used to precisely position a semiconductor die over a solid object which substantially blocks the flows of pressurized air (e.g., a semiconductor device package).

Furthermore, both air tables and vacuum wands require die manipulation by a human operator (i.e., a user). Required semiconductor device manufacturing operations tend to be tedious and repetitive. Human operators make mistakes and suffer from fatigue over time. The frequency of mistakes made by human operators increases with fatigue, as does the amount of time required to perform a given task. Automated systems, on the other hand, tirelessly perform tedious and repetitive tasks the same way every time, reducing variability in both the end result and the amount of time required to accomplish a given task.

It would thus be beneficial to have a method and apparatus for manipulating a semiconductor die during a semiconductor device manufacturing operation which does not involve physical contact with the die, works in the presence of common semiconductor device packages, and allows for automation of the manipulation process. The desired manipulation method and apparatus would significantly reduce the possibility of physical damage and ionic contamination to a semiconductor die during a required operation, allow positioning of the semiconductor die above a device package during a packaging operation, and eliminate human variability and error in the performance of the required operation.

SUMMARY OF THE INVENTION

The problems outlined above are in large part solved by a method and apparatus for the non-contact manipulation of a semiconductor die during semiconductor device manufacturing. Multiple die manipulation circuits are formed within specific regions of die areas of a semiconductor wafer. The die manipulation circuits may be formed upon a frontside surface of the wafer or a backside surface of the wafer. Following separation of the semiconductor dice from the wafer, a die is positioned above a horizontal surface of a die manipulation apparatus. Each die manipulation circuit receives alternating current (a.c.) power via an alternating magnetic field and uses the a.c. power to produce a static magnetic field. The static magnetic field opposes one or more static magnetic fields formed around levitation coils of the die manipulation apparatus, causing the die to be levitated above a horizontal surface of the die manipulation apparatus. By varying the relative strengths of the magnetic fields, "waves" of magnetic flux may be formed. Such waves of magnetic flux may be used to move the die parallel to the horizontal surface, or to rotate the die in a horizontal plane about an axis normal to the horizontal surface.

The horizontal surface of the die manipulation apparatus includes transmitter coils in addition to levitation coils. The transmitter and levitation coils are electrical inductors, and are evenly distributed across the horizontal surface. Each transmitter coil receives a.c. electrical power and produces an alternating magnetic field in response to the a.c. electrical power. Each levitation coil of the horizontal surface receives direct current (d.c.) electrical power and produces a static magnetic field in response to the d.c. electrical power.

Each die manipulation circuit includes a pickup coil, a levitation coil, a rectifier, and a capacitor. During die manipulation, the pickup coil receives a portion of the a.c.

electrical power delivered to one or more transmitter coils of the horizontal surface via the alternating magnetic fields produced by the one or more transmitter coils. As a result, an a.c. voltage is produced between the terminals of the pickup coil. The rectifier half wave rectifies the a.c. voltage, providing time varying d.c. voltage and current (i.e., d.c. electrical power) to the levitation coil of the die manipulation circuit. The capacitor reduces fluctuations in (i.e., performs a smoothing action upon) the time varying d.c. voltage and current delivered to the levitation coil of the die manipulation circuit. The levitation coil of the die manipulation circuit creates a substantially time invariant (i.e., static) magnetic field in response to the d.c. electrical power.

During use of the die manipulation apparatus, electrical power is applied to each transmitter coil and each levitation coil of the horizontal surface. A semiconductor die is then positioned above the horizontal surface. The pickup coil of each die manipulation circuit on the surface of the semiconductor die receives a portion of the a.c. electrical power provided to one or more nearby transmitter coils via the alternating magnetic fields created by the one or more transmitter coils. The a.c. electrical power received by the pickup coil is converted to d.c. electrical power and provided to the levitation coil of the die manipulation circuit. The static magnetic field produced by the levitation coil of the die manipulation circuit opposes static magnetic fields created by one or more levitation coils of the horizontal surface. As a result, a force is created within the semiconductor die which opposes the gravitational force acting upon the semiconductor die, and the semiconductor die is levitated above the horizontal surface.

The semiconductor die comes to rest at a height above the horizontal surface at which the force exerted upon the semiconductor die by the opposing magnetic fields is equal to and opposite to the gravitational force acting upon the semiconductor die. Flows of a.c. current through the transmitter coils are adjusted to obtain a desired levitation height. Waves of magnetic flux may be created by varying the flows of current through the levitation or transmitter coils of the horizontal surface. These waves of magnetic flux may be used to move the semiconductor die parallel to the horizontal surface, or to rotate the semiconductor die in a horizontal plane about an axis normal to the horizontal surface.

BRIEF DESCRIPTION OF THE DRAWINGS

Other objects and advantages of the invention will become apparent upon reading the following detailed description and upon reference to the accompanying drawings in which:

FIG. 3 is a top plan view of the backside surface of the semiconductor wafer of FIGS. 1a–b illustrating the corresponding boundaries of the multiple die areas of FIG. 1a;

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 1A:
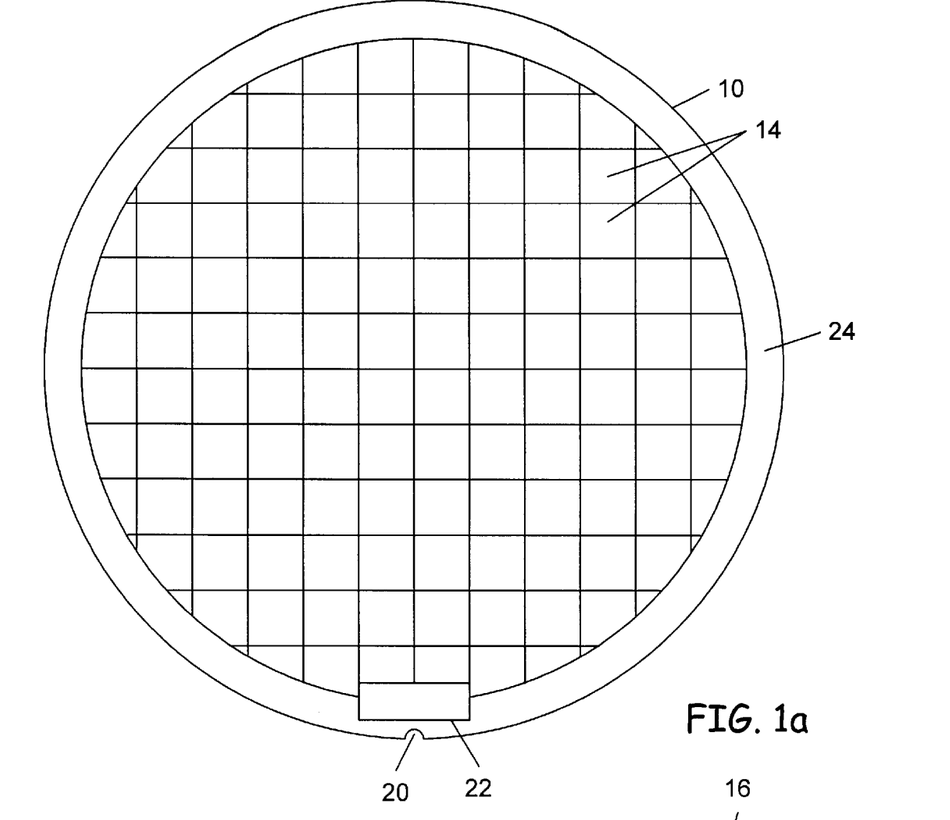
FIG. 1a is a top plan view of a frontside surface of a semiconductor wafer partitioned into multiple die areas in accordance with common wafer fabrication practice.
Figure 1B:
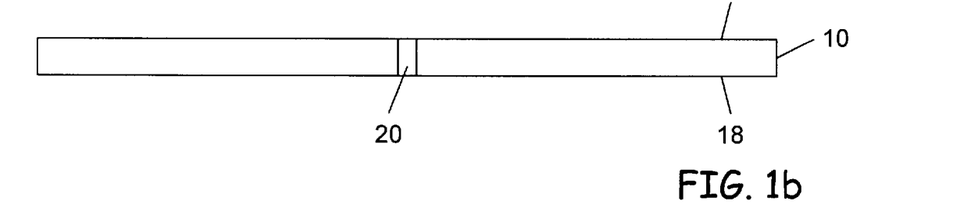
FIG. 1b is a side elevation view of the semiconductor wafer of FIG. 1a illustrating the orientation of the frontside surface to a backside surface.

FIG. 1a is a top plan view of a frontside surface of a semiconductor wafer 10 partitioned into multiple die areas 14. Semiconductor wafer 10 has two opposed and substantially planar sides, the frontside surface and a backside surface. FIG,. 1b is a side elevation view of semiconductor wafer 10 illustrating the orientation of frontside surface 16 to a backside surface 18. Current wafer fabrication processes form electronic devices upon and within specially-prepared frontside surfaces of semiconductor wafers. Following lapping and grinding processes, the frontside surface of a semiconductor wafer is typically subjected to a chemical-mechanical polishing step in order to produce a surface which is scratch and damage free.

During wafer fabrication, one or more semiconductor devices are formed upon frontside surface 16 of semiconductor wafer 10 within the boundaries of each die area 14. Following formations of the semiconductor devices, semiconductor wafer 10 is separated into individual dice. Semiconductor wafer 10 has a notch 20 which indicates the orientation of the crystalline structure. The manufacturer of semiconductor wafer 10 typically includes manufacturing data in a scribe area 22 on frontside surface 16. This manufacturing data may include, for example, the name of the manufacturing company, the date of manufacture, a serial number, and the type of dopant atoms incorporated into the crystalline structure (i.e., p-type or n-type). Semiconductor wafer 10 also typically includes an exclusion zone 24 around the outer periphery of the frontside surface in which electronic devices are not formed.

Figure 2:
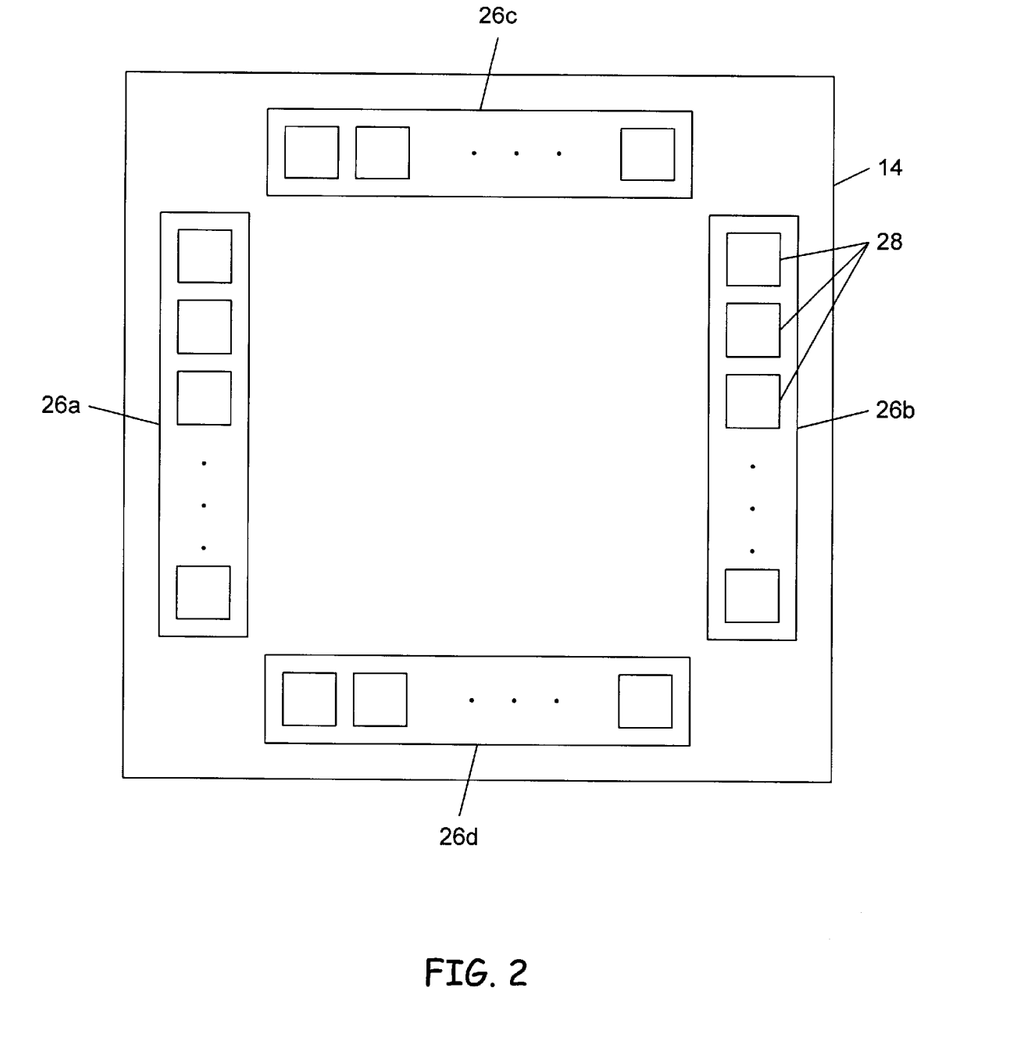
FIG. 2 is a top plan view of the frontside surface of a die area of FIG. 1a including four prospective regions about the periphery of the die area which may be reserved for linear arrays of die manipulation circuits in accordance with one embodiment of the present invention.

FIG. 2 is a top plan view of the frontside surface of a die area 14 including four prospective regions 26a–d about the periphery of die area 14 which may be reserved for linear arrays of die manipulation areas 28 in accordance with one embodiment of the present invention. A separate die manipulation circuit is formed within each die manipulation area 28 and used to manipulate the semiconductor die during required operations. At least two opposed regions of prospective regions 26a–d are selected to contain linear arrays of die manipulation areas 28. For example, regions 26a and 26b may be reserved for linear arrays of die manipulation areas 28. Alternately, regions 26c and 26d may be reserved for linear arrays of die manipulation areas 28. In addition, all four regions 26a–d may be reserved for linear arrays of die manipulation areas 28. It is noted that the frontside surface is very valuable and largely reserved for operational semiconductor device structures. As a result, the availabilities of regions of the frontside surface for die manipulation areas 28 is believed to be limited.

Figure 3:
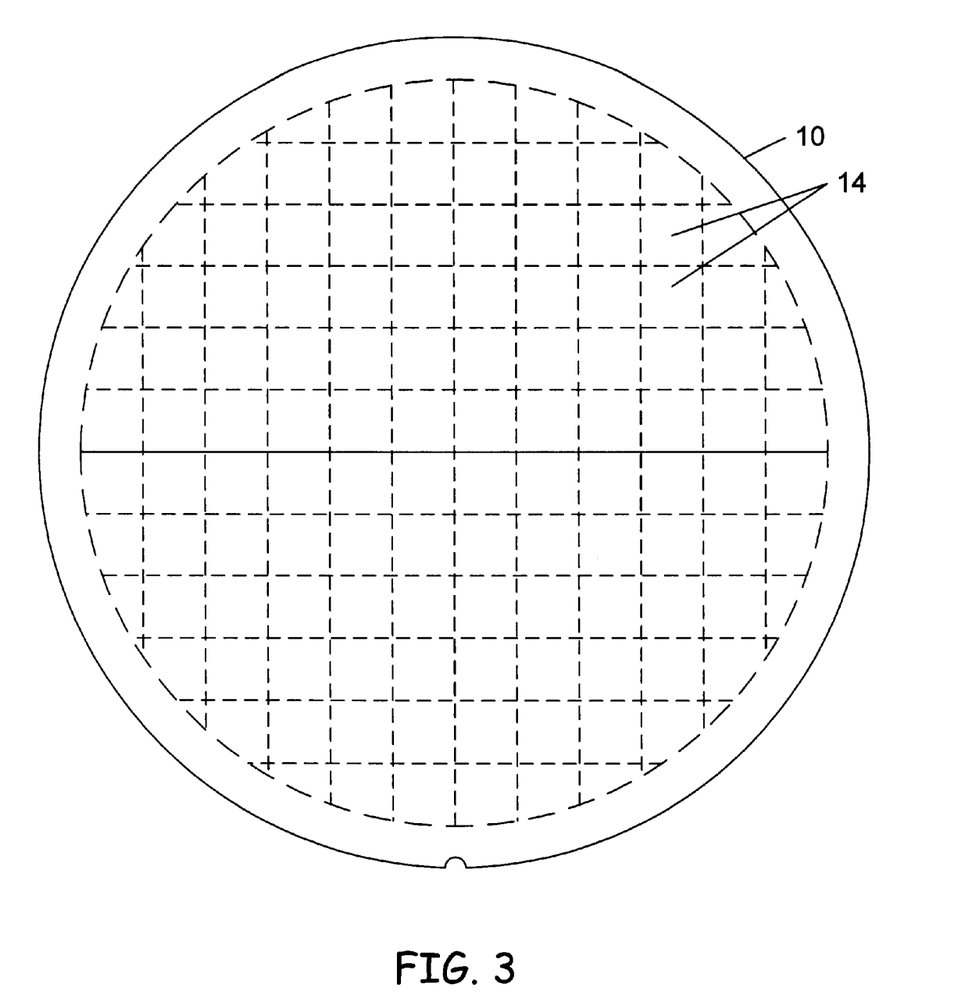
Figure 4:
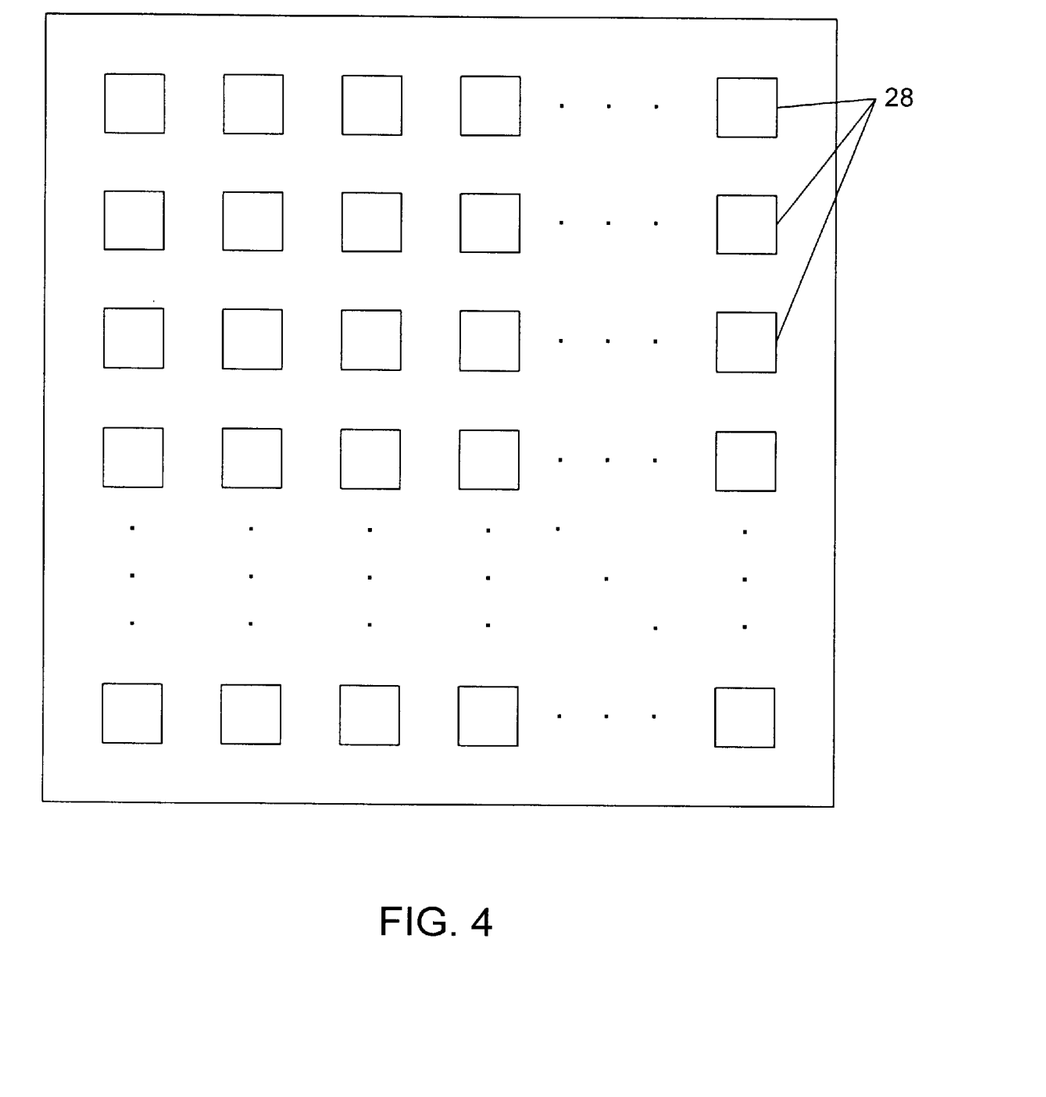
FIG. 4 is a top plan view of the backside surface of a die area of FIG. 3 upon which two-dimensional arrays of die manipulation circuits may be formed in accordance with an alternate embodiment of the present invention.

FIG. 3 is a top plan view of backside surface 18 of semiconductor wafer 10 illustrating the corresponding boundaries of the multiple die areas 14. As semiconductor device structures are typically formed only upon and within frontside surface 16, virtually the entire portion of backside surface 18 within each die area is available for one or more die manipulation areas 28. Hence it may be advantageous to locate die manipulation areas 28 upon backside surface 18 of semiconductor wafer 10. FIG. 4 is a top plan view of the backside surface of a die area 14 including a two-dimensional array of die manipulation areas 28 in accordance with an alternate embodiment of the present invention.

Figure 5:
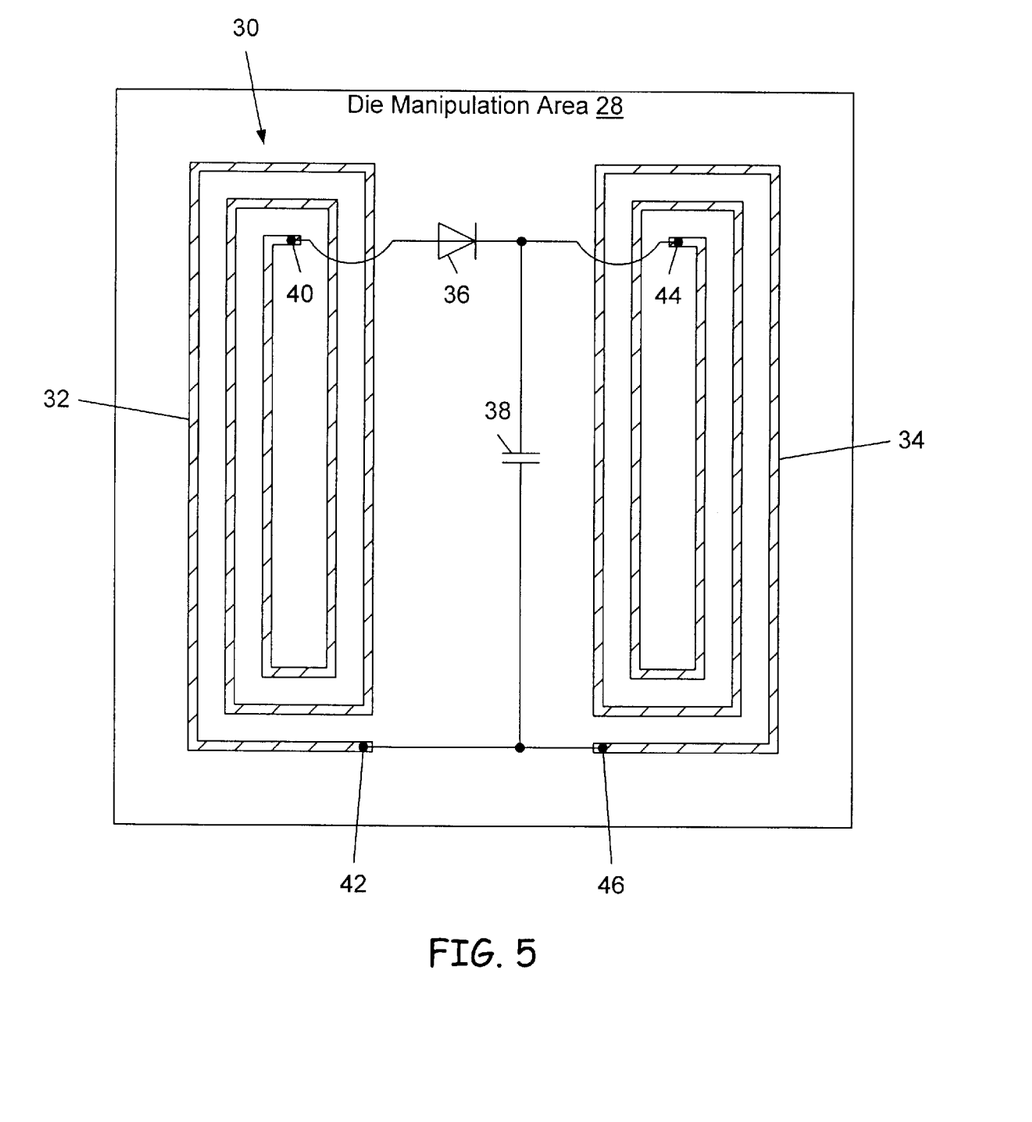
FIG. 5 is a top plan view of one embodiment of a die manipulation circuit of the present invention, wherein the die manipulation circuit includes a pickup coil, a levitation coil, a rectifier, and a capacitor.

FIG. 5 is a top plan view of one embodiment of a die manipulation circuit 30 formed within each die manipulation area 28. Die manipulation circuit 30 includes several electronic components connected together to form a circuit which receives transmitted electrical energy via an alternating magnetic field and uses the received electrical energy to produce a static magnetic field. Die manipulation circuit 30 includes a pickup coil 32, a levitation coil 34, a rectifier 36, and a capacitor 38. Pickup coil 32 is configured to receive electrical energy transmitted in the form of an alternating magnetic field. Pickup coil 32 includes a first terminal 40 and a second terminal 42. Levitation coil 34 is configured to produce a static magnetic field in response to direct current (d.c.) electrical power. Levitation coil 34 includes a first terminal 44 and a second terminal 46. Second terminal 46 of levitation coil 34 is connected to second terminal 42 of pickup coil 32. Rectifier 36 is connected between first terminal 40 of pickup coil 32 and first terminal 44 of levitation coil 34. Capacitor 38 is connected between first terminal 44 of levitation coil 34 and second terminal 46 of levitation coil 34.

During die manipulation, pickup coil 32 is subjected to an alternating magnetic field. As a result, an a.c. voltage is produced between first terminal 40 and second terminal 42 of pickup coil 32. Rectifier 36 half wave rectifies the a.c. voltage, providing time varying d.c. voltage and current (i.e., d.c. electrical power) to levitation coil 34. Capacitor 38 reduces fluctuations in (i.e., performs a smoothing action upon) the time varying d.c. voltage and current delivered to levitation coil 34. Levitation coil 34 creates a substantially time invariant (i.e., static) magnetic field around itself in response to the delivered d.c. power.

Planar inductors are desirable for use in semiconductor devices as they are easily formed from a single layer of a conductive material. In the embodiment of FIG. 5, pickup coil 32 and levitation coil 34 are both rectangular planar inductors. For specific planar rectangular inductor design information, see "Design of Planar Rectangular Microelectronic Inductors" by H. M. Greenhouse, *IEEE Transactions on Parts, Hybrids, and Packaging*, Vol. 10, No. 2, June 1974, pp. 101–109. Alternately, pickup coil 32 and levitation coil 34 may be planar spiral inductors. For specific planar spiral inductor design information, see *Computer-Aided Design of Microwave Circuits* by K. C. Gupta et al., Artech House, Inc., 1981, pp. 209–212.

Figure 6A:
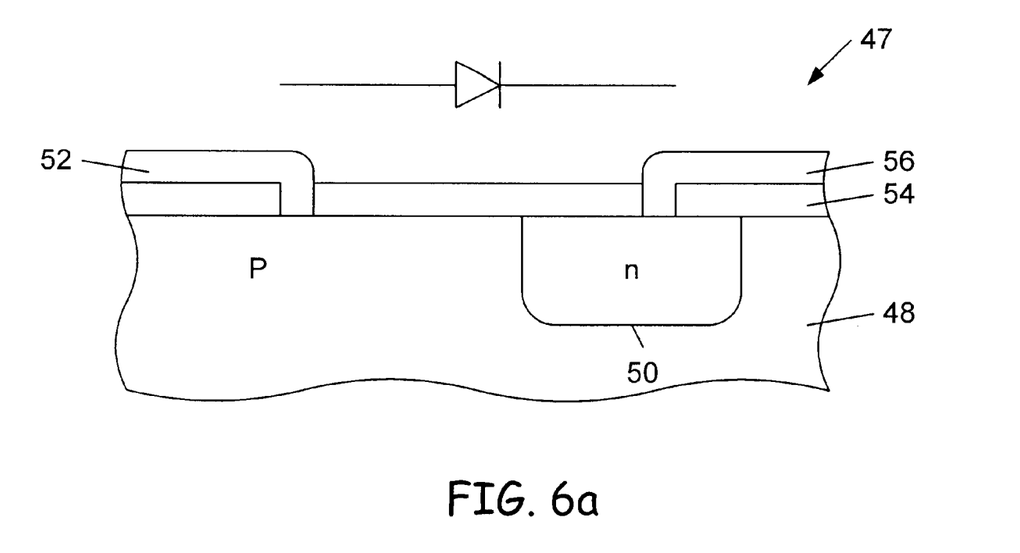
FIG. 6a is a cross-sectional view of one embodiment of the rectifier of FIG. 5, wherein the rectifier is a p-n junction diode formed upon and within the surface of a p-type semiconductor wafer.

P-n junction diodes are routinely formed upon and within semiconductor wafers. FIG. 6a is a cross-sectional view of one embodiment of rectifier 36 of FIG. 5, wherein rectifier 36 is a p-n junction diode 47 formed upon and within the surface of a p-type semiconductor wafer 48. An n-type region 50 is formed within p-type semiconductor wafer 48 by introducing n-type dopant atoms (e.g., arsenic or phosphorus). A first electrical conductor 52 makes electrical contact with p-type semiconductor wafer 48 through a first hole in a dielectric layer 54, and a second electrical conductor 56 makes an electrical contact with n-type region 50 through a second hole in dielectric layer 54. Conventional current (i.e., a flow of positive charge carriers) flows only from electrical conductor 52 to electrical conductor 56, and only when a positive electrical potential exists between electrical conductor 52 and electrical conductor 56.

Figure 6B:
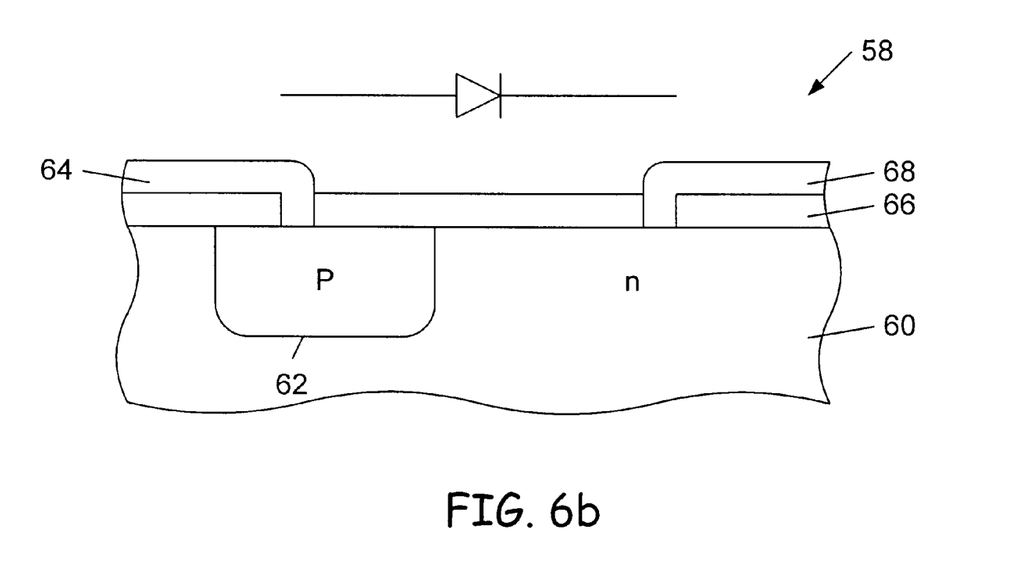
FIG. 6b is a cross-sectional view of an alternate embodiment of the rectifier of FIG. 5, wherein the rectifier is a p-n junction diode formed upon and within the surface of an n-type semiconductor wafer.

FIG. 6b is a cross-sectional view of an alternate embodiment of rectifier 36 of FIG. 5, wherein rectifier 36 is a p-n junction diode 58 formed upon and within the surface of an n-type semiconductor wafer 60. A p-type region 62 is formed within n-type semiconductor wafer 60 by introducing p-type dopant atoms (e.g., boron). A first electrical conductor 64 makes electrical contact with the p-type region through a first hole in a dielectric layer 66, and a second electrical conductor 68 makes an electrical contact with n-type semiconductor wafer 60 through a second hole in dielectric layer 66. Conventional current flows only from electrical conductor 64 to electrical conductor 68, and only when a positive electrical potential exists between electrical conductor 64 and electrical conductor 68.

Figure 7:
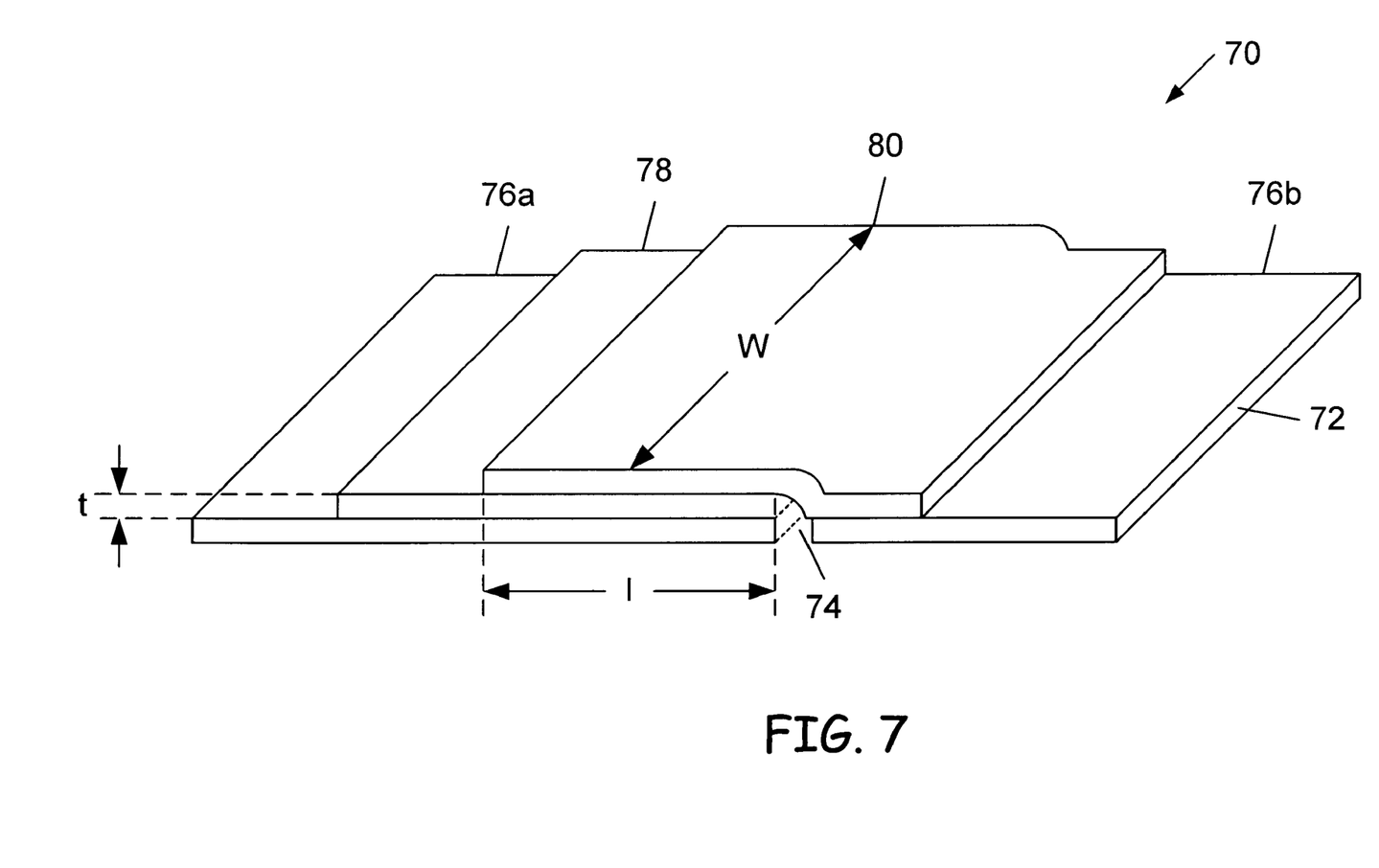
FIG. 7 is an isometric view of one embodiment of the capacitor of FIG. 5, wherein the capacitor is a parallel plate capacitor having a dielectric layer positioned between two electrically conductive layers.

Parallel plate capacitors are also desirable for use in semiconductor devices, and are typically formed by depositing a layer of a dielectric material between two layers of conductive material. FIG. 7 is an isometric view of one embodiment of capacitor 70 in which capacitor 70 is a parallel plate capacitor. A first conductive layer 72 is formed upon an insulating substrate, and an opening 74 is formed which divides conductive layer 72 into two sections 76a and 76b. A layer of a dielectric material 78 is deposited over a portion of section 76a and within opening 74. A second conductive layer 80 is then formed over a portion of dielectric layer 78 and an adjacent portion of section 76b. Capacitor 70 is thus formed between sections 76a and 76b of conductive layer 72. First conductive layer 72 and second conductive layer 80 may be made of, for example, aluminum. Dielectric layer 78 may be made of, for example, silicon dioxide. The achieved capacitance of capacitor 70 is directly proportional to width w of second conductive layer 80, length l of the overlap between second conductive layer 80 and section 76a, and the permittivity of dielectric layer 78, and is inversely proportional to thickness t of dielectric layer 78.

Figure 8:
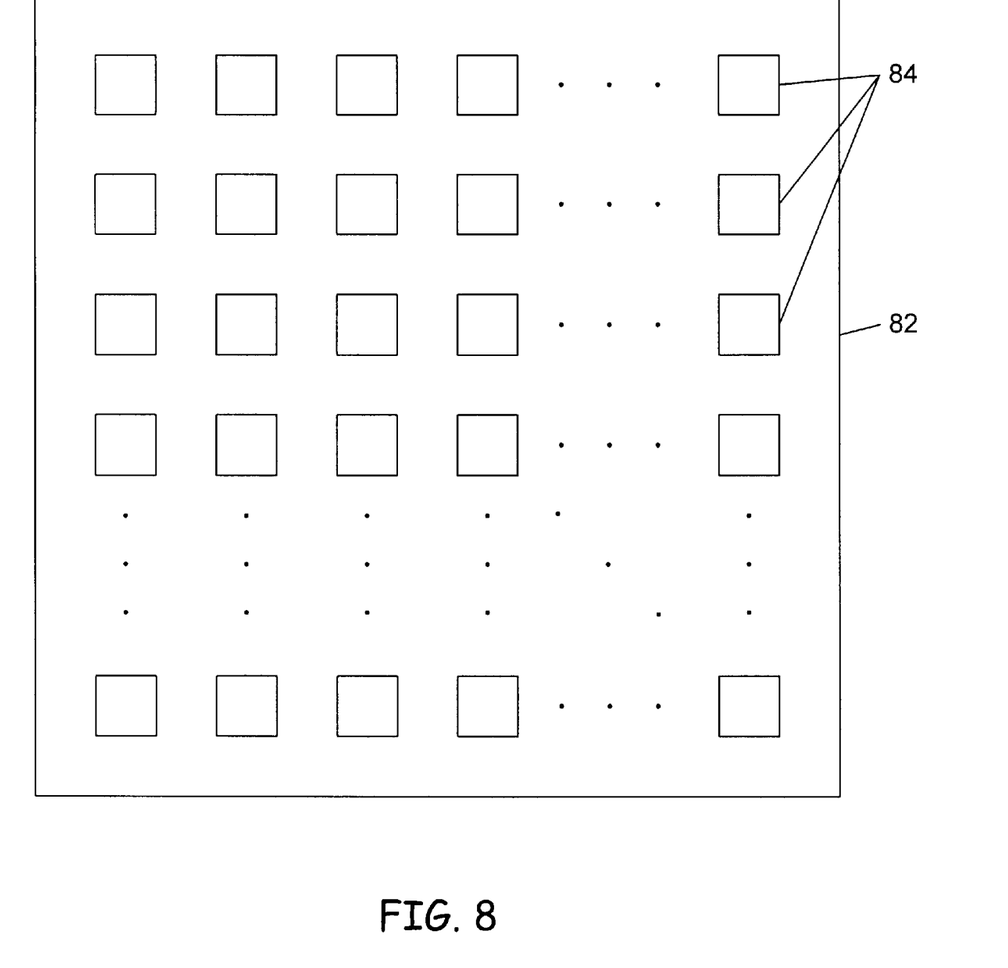
FIG. 8 is a top plan view of one embodiment of a flat horizontal surface of a die manipulation apparatus for non-contact manipulation of a semiconductor die in accordance with the present invention, wherein the horizontal surface includes a two-dimensional array of inductive coil areas.

A die manipulation apparatus for non-contact manipulation of a semiconductor die includes die manipulation circuits 33 formed upon the semiconductor die and a flat horizontal surface. The semiconductor die is levitated above and moved laterally with respect to the horizontal surface. FIG. 8 is a top plan view of one embodiment of the flat horizontal surface 82 of the die manipulation apparatus. Horizontal surface 82 defines, for example, a work plane for required operations. Horizontal surface 82 is much larger than a semiconductor die, and is preferably an upper surface of a table. During performance of a required operation, a semiconductor die is to be moved in relation to horizontal surface 82. Horizontal surface 82 has multiple inductive coil areas 84 arranged in a two-dimensional matrix.

Figure 9:
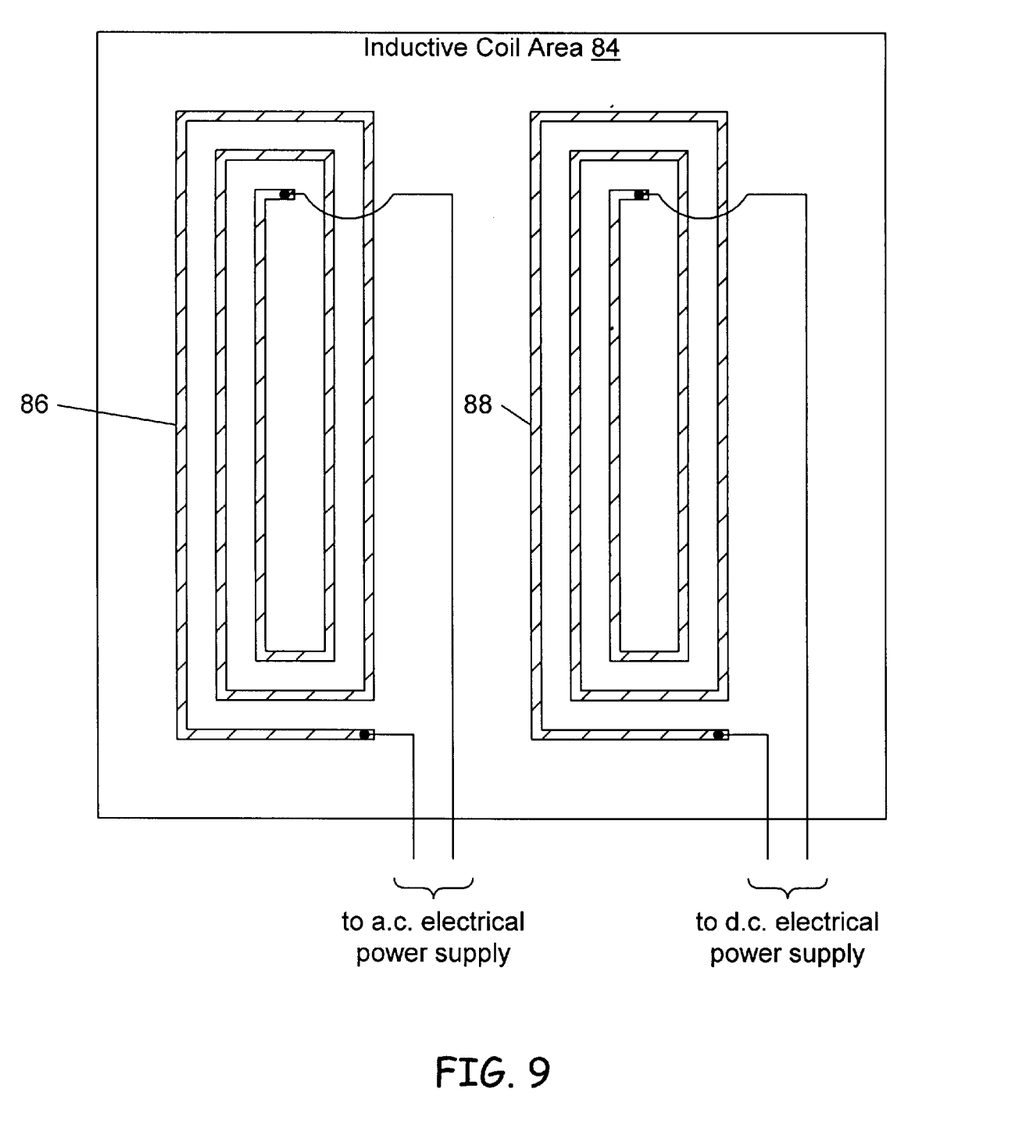
FIG. 9 is a top plan view of one embodiment of an inductive coil area of the horizontal surface of FIG. 8, wherein each inductive coil area includes a transmitter coil and a levitation coil.

FIG. 9 is a top plan view of one embodiment of inductive coil area 84. Each inductive coil area 84 includes a transmitter coil 86 and a levitation coil 88. During use of the die manipulation apparatus, each transmitter coil 86 is connected to an a.c. electrical power supply, and each levitation coil 88 is connected to a d.c. electrical power supply. Each transmitter coil 86 produces an alternating magnetic field in response to the a.c. electrical power, and each levitation coil 88 produces a static magnetic field in response to the d.c. electrical power.

Figure 10:
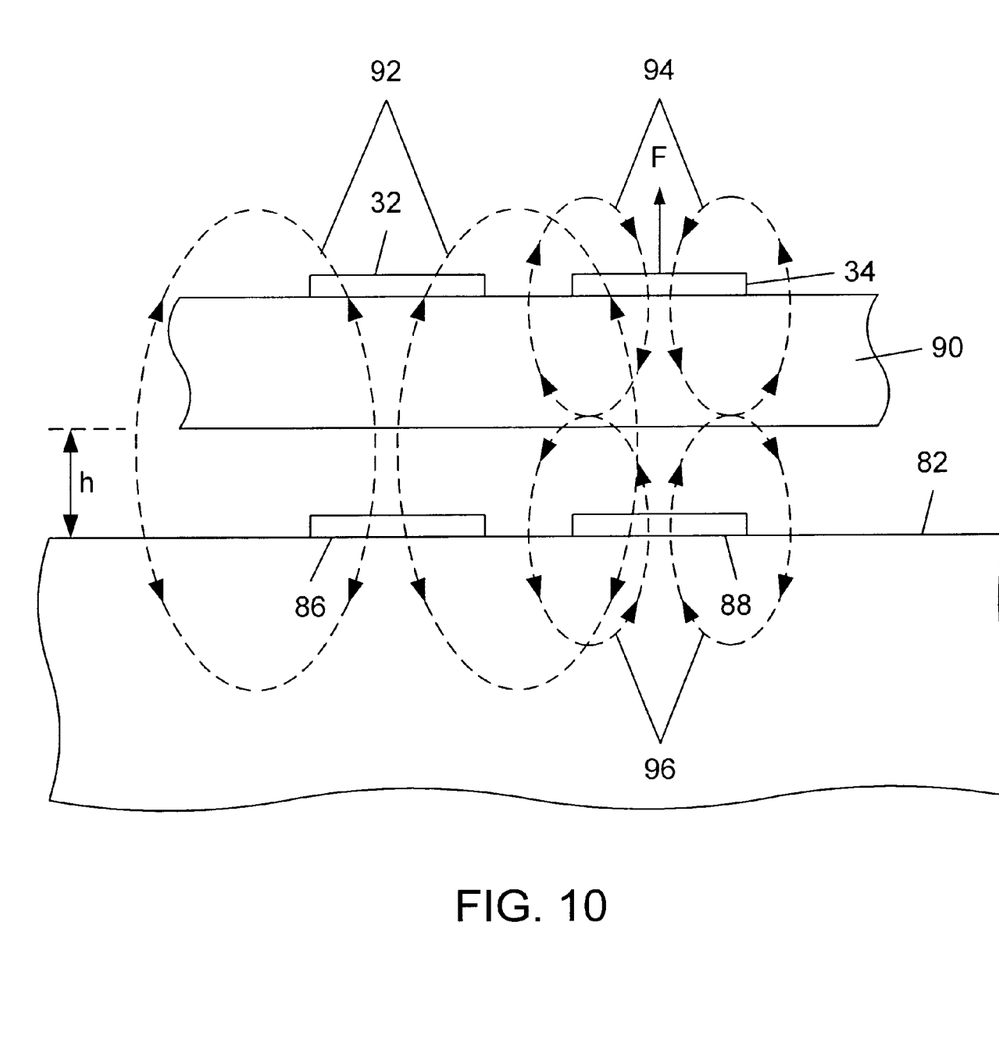
FIG. 10 is a cross-sectional view of a semiconductor die levitated above the horizontal surface of FIG. 8 during use, wherein levitation is achieved by opposing magnetic fields.

FIG. 10 is a cross-sectional view of a semiconductor die 90 levitated above horizontal surface 82 during operation of the die manipulation apparatus. After power is applied to each transmitter coil and each levitation coil, semiconductor die 90 is positioned above horizontal surface 82. A pickup coil 32 on the surface of semiconductor die 90 and in proximity to a transmitter coil 86 receives a portion of the a.c. electrical power provided to the transmitter coil 86 via the alternating magnetic field created by the transmitter coil 86. The a.c. electrical power received by pickup coil 32 is converted to d.c. electrical power and provided to levitation coil 34 as described above. Levitation coil 34 produces a static magnetic field 94 in response to the d.c. electrical power. The static magnetic field 94 opposes a static magnetic field 96 created by a levitation coil 88 of horizontal surface 82. As a result, a force F is created which opposes the gravitational force acting upon semiconductor die 90, and semiconductor die 90 is levitated above horizontal surface 82.

A flow of a.c. current through transmitter coil 86 determines a height h at which semiconductor die 90 is levitated above horizontal surface 82, and is adjusted to obtain a desired height h. At a given height h, force F is equal to and opposite the gravitational force acting upon semiconductor die 90. The frequency of the a.c. electrical power provided to each of the transmitter coils 86 is preferably above a frequency to which semiconductor die 90 can respond. In this case, height h remains substantially stable.

Figure 11A:
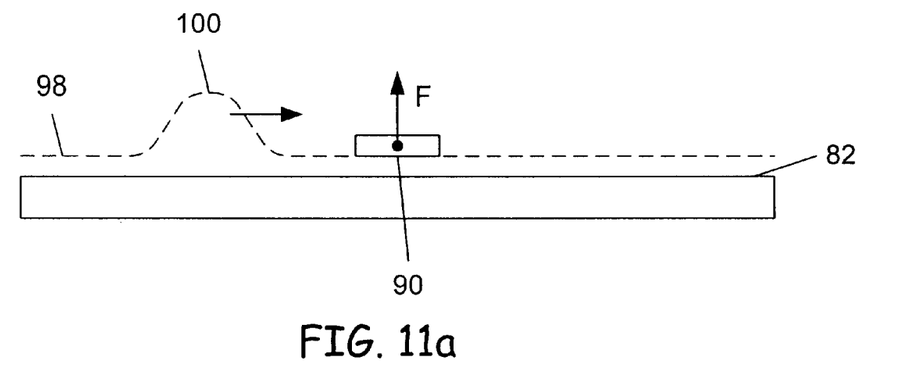
FIG. 11a is a side elevation view of a semiconductor die levitated above the horizontal surface of the die manipulation apparatus of FIG. 8, wherein a "wave" of magnetic flux is moving across the horizontal surface toward the semiconductor die.
Figure 11B:
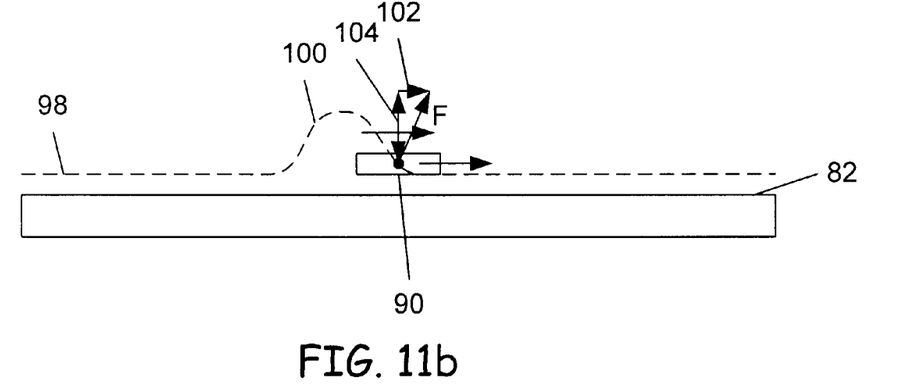
FIG. 11b is a side elevation view of the semiconductor die of FIG. 11a as the wave of magnetic flux reaches the semiconductor die, wherein the semiconductor die moves with the wave of magnetic flux as the wave of magnetic flux sweeps across the semiconductor die.
Figure 11C:
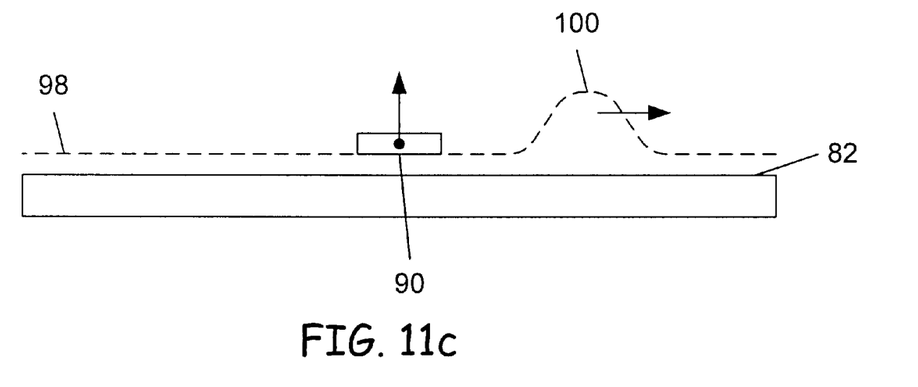
FIG. 11c is a side elevation view of the semiconductor die of FIG. 11a after the wave of magnetic flux has swept across the semiconductor die, wherein the wave of magnetic flux has moved the semiconductor die in a horizontal direction.

It is noted that should levitation coils 34 and 88 become misaligned laterally, opposing and misaligned magnetic fields 34 and 88 will result in force F having a horizontal component, and semiconductor die 90 will move laterally with respect to horizontal surface 82. FIGS. 11a–c will now be used to describe how semiconductor die 90 may be moved laterally with respect to horizontal surface 82 in a controlled fashion. FIG. 11a is a side elevation view of semiconductor die 90 levitated above horizontal surface 82. Dashed line 98 above horizontal surface 82 represents the magnitudes of magnetic flux produced by levitation coils 88 of horizontal surface 82. A force F acting upon Semiconductor die 90 in FIG. 11a is substantially vertical and equal to the opposing force of gravity. By varying, the flow of d.c. current through levitation coils 88, a "wave" of magnetic flux 100 is created. In FIG. 11a, the wave of magnetic flux 100 is moving across horizontal surface 82 toward semiconductor die 90.

FIG. 11b is a side elevation view of semiconductor die 90 levitated above horizontal surface 82 as the wave of magnetic flux 100 reaches semiconductor die 90. The magnitudes of the magnetic fields between the levitation coils of semiconductor die 90 and horizontal surface 82 increase in the presence of the wave of magnetic flux 100. Stronger magnetic fields pushing semiconductor die 90 in the direction of motion of the wave of magnetic flux 100 overcome weaker magnetic fields opposing such motion. As a result, force F acting upon semiconductor die 90 has a horizontal component 102 in addition to a vertical component 104. Horizontal component 102 is in the direction of motion of the wave of magnetic flux 100, and causes semiconductor die 90 to move with the wave of magnetic flux 100 as the wave of magnetic flux 100 sweeps across semiconductor die 90.

FIG. 11c is a side elevation view of semiconductor die 90 levitated above horizontal surface 82 after the wave of magnetic flux 100 has swept across semiconductor die 90. As in FIG. 11a, force F acting upon semiconductor die 90 in FIG. 11c is substantially vertical and equal to the opposing force of gravity. As a result of the wave of magnetic flux 100, semiconductor die 90 has been moved in a direction parallel to horizontal surface 82.

It is noted that the wave of magnetic flux 100 may also be created by varying the flows of a.c. current through transmitter coils 86. It is also noted that sequences of waves of magnetic flux 100 may be used to move semiconductor device 90 a desired horizontal distance. The position of semiconductor die 90 over horizontal surface 82 can be ascertained by sensing the flows of current in either transmitter coils 86 or levitation coils 88. The difference between a current position of semiconductor die 90 and a desired position of semiconductor die 90 may be used to generate one or more waves of magnetic flux in order to achieve the desired position. The strengths and directions of motion of the one or more waves of magnetic flux may be varied in order to achieve the desired position of semiconductor die 90. Semiconductor die 90 may also be rotated in a horizontal plane by generating "swirls" of magnetic flux about semiconductor die 90. Thus a desired position and orientation of semiconductor die 90 may both be achieved. A wand emitting a signal which may be received by transmitter coils 86 or levitation coils 88 may be used to indicate a desired position of semiconductor die 90.

It will be appreciated by those skilled in the art having the benefit of this disclosure that this invention is believed to be a method and apparatus for non-contact manipulation of a semiconductor die. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A semiconductor die, comprising:
   a first inductive coil and a second inductive coil arranged upon a surface of the die, wherein the first inductive coil is adapted for receiving energy and for providing at least a portion of the received energy to the second inductive coil, and wherein the second inductive coil is adapted for using the energy received from the first inductive coil to create a magnetic field.

2. An apparatus for moving a semiconductor die, comprising:
   a first inductive coil and a second inductive coil arranged upon a surface of the die, wherein the first inductive coil is adapted for receiving energy and for providing at least a portion of the received energy to the second inductive coil, and wherein the second inductive coil is adapted for using the energy received from the first inductive coil to create a first magnetic field; and
   a third inductive coil and a fourth inductive coil arranged on a surface distal from the semiconductor die, wherein the third inductive coil is adapted for dispatching the energy received by the first inductive coil, and wherein the fourth inductive coil is adapted for creating a second magnetic field.

3. An apparatus for moving a semiconductor die, comprising:
   a first surface of the semiconductor die comprising a plurality of die manipulation circuits configured to receive alternating current (a.c.) power and to produce a static magnetic field; and
   a second surface separate from the first surface, said second surface comprising a plurality of inductive coils, wherein a portion of the plurality of inductive coils are transmitter coils and the remainder of the plurality of inductive coils are levitation coils, and wherein each transmitter coil is coupled to receive a.c. electrical power and configured to produce an alternating magnetic field in response to the a.c. electrical power, and wherein each levitation coil is coupled to receive d.c. electrical power and configured to produce a static magnetic field in response to the d.c. electrical power.

4. The apparatus as recited in claim 3, wherein each of the plurality of die manipulation circuits comprises:
   a pickup coil configured to receive a portion of the a.c. electrical power via the alternating magnetic field produced by at least one transmitter coil, wherein the pickup coil comprises first and second terminals;
   a levitation coil configured to produce a static magnetic field in response to d.c. electrical power, wherein the levitation coil comprises first and second terminals, and wherein the second terminal of the levitation coil is connected to the second terminal of the pickup coil; and
   a rectifier connected between the first terminal of the pickup coil and the first terminal of the levitation coil, wherein the rectifier converts the portion of the a.c. electrical power received by the pickup coil to d.c. electrical power and delivers the d.c. electrical power to the levitation coil.

5. The apparatus as recited in claim 4, wherein each die manipulation circuit further comprises a capacitor connected between the first and second terminals of the levitation coil, and wherein the capacitor reduces fluctuations in the d.c. electrical power delivered to the levitation coil.

6. The apparatus as recited in claim 4, wherein a flow of a.c. current through at least one transmitter coil located directly below the semiconductor die is adjusted such that the static magnetic field produced by the levitation coil of each die manipulation circuit opposes the static magnetic field produced by at least one levitation coil of the horizontal surface, and wherein a force is created within the semiconductor die.

7. The apparatus as recited in claim 6, wherein the force is substantially vertical and opposes the gravitational force acting upon the semiconductor die, and wherein the semiconductor die comes to rest a vertical distance above the horizontal surface where the resultant force is equal to the gravitational force.

8. The apparatus as recited in claim 7, wherein the flows of a.c. current through a portion of the transmitter coils are varied such that the resultant force includes a horizontal component which causes the semiconductor die to move parallel to the horizontal surface.

9. The apparatus for moving a semiconductor die as recited in claim 2, wherein the first and second magnetic fields oppose one another such that a force is created within the semiconductor die.

10. The apparatus for moving a semiconductor die as recited in claim 9, wherein the force created within the semiconductor die opposes a force due to gravity acting upon the semiconductor die.

11. The apparatus for moving a semiconductor die as recited in claim 10, wherein the force created within the semiconductor die has a magnitude greater than a magnitude of the force due to gravity.

* * * * *